United States Patent
Martin et al.

(10) Patent No.: US 6,562,471 B1
(45) Date of Patent: May 13, 2003

(54) ALUMINUM-TITANIUM ALLOY WITH HIGH SPECULAR REFLECTIVITY, REFLECTING COATINGS COMPRISING SAME AND MIRRORS AND PARTS COMPRISING SAID COATING

(75) Inventors: Michel Martin, Mions (FR); Frédéric Faverjon, Unieux (FR); Janick Moreau, Samoreau (FR); Jean-Marc Poirson, Saint-Etienne le Mollard (FR); Jean-Paul Terrat, Saint-Etienne (FR)

(73) Assignee: Centre Stephanois de Recherches Mecaniques Hydromecanique et Frottement, Andrezieux-Boutheon (FR)

( * ) Notice: Subject to any disclaimer, the term of this patent is extended or adjusted under 35 U.S.C. 154(b) by 0 days.

(21) Appl. No.: 09/787,510
(22) PCT Filed: Jul. 19, 2000
(86) PCT No.: PCT/FR00/02074
§ 371 (c)(1), (2), (4) Date: May 10, 2001
(87) PCT Pub. No.: WO01/06026
PCT Pub. Date: Jan. 25, 2001

(30) Foreign Application Priority Data

Jul. 19, 1999 (FR) .............................. 99 09335

(51) Int. Cl.⁷ ................................. B32B 15/04
(52) U.S. Cl. .................. 428/457; 148/437; 420/552; 420/590; 428/912.2; 428/926
(58) Field of Search ............... 428/457, 912.2, 428/926; 420/552, 590; 148/437

(56) References Cited

U.S. PATENT DOCUMENTS

| 4,992,087 A | 2/1991 | Hölscher |
| 5,976,641 A | * 11/1999 | Onishi et al. ............... 420/552 |

FOREIGN PATENT DOCUMENTS

| JP | 61-133902 | 6/1986 |
| JP | 6-28717 | 2/1994 |
| JP | 7-90566 | 4/1995 |

OTHER PUBLICATIONS

T.B. Massalski, "Binary Alloy Phase Diagrams", vol. 1, pp175–176, 1986 (No month given).

* cited by examiner

*Primary Examiner*—Robert R. Koehler
(74) *Attorney, Agent, or Firm*—Young & Thompson

(57) ABSTRACT

The metal alloy based on aluminium and titanium includes an aluminium content between 80 and 90 atomic percent and a titanium content between 10 and 20 atomic percent. The alloy is microcrystalline and outside thermodynamic equilibrium, the alloy is thereby resistant to oxidation and corrosion and has at the same time remarkable adhesion to polymer materials. The metal alloy can be in the form of a reflecting coating of a thickness ranging between 0.01 and 3 $\mu$m, covered with a protective film of a polymer material. A mirror having specular reflectivity not less than about 65%, good resistance to corrosion and oxidation includes a substrate of a polymer material supporting the reflecting coating.

23 Claims, No Drawings

ALUMINUM-TITANIUM ALLOY WITH HIGH SPECULAR REFLECTIVITY, REFLECTING COATINGS COMPRISING SAME AND MIRRORS AND PARTS COMPRISING SAID COATING

FIELD OF THE INVENTION

The present invention relates to a new aluminium-titanium alloy of high specular reflectivity, reflective coatings comprising the alloy and mirrors and components including the coating.

The invention relates more particularly to the design and manufacture of special mirrors. Special mirrors are mirrors whose optical characteristics must lie within a well-defined range and which must be preserved in their entirety, even if they are subjected to severe constraints. Examples of severe constraints that are not limiting on the invention are particularly corrosive atmospheres, such as moist atmospheres, with or without condensation, in the presence of chemical agents such as sodium chloride, for example. Even more particularly, but without this being limiting on the invention, the invention relates to mirrors made by depositing a layer of metal onto a plastics material or composite material support; in the latter case, the interface between the reflective coating and the substrate, which is usually a polymer, is particularly sensitive to the environment and is the site of irreversible deterioration.

BACKGROUND OF THE INVENTION

Special mirrors to resist aggressive environments are often made by depositing a layer of metal onto a support providing an adequate structure. The metal layer is then protected against mechanical, chemical or other aggression by a transparent protective film. One non-limiting example of a protective film is a metal oxide or oxynitride, although for economic reasons it is very often a polymer.

A mirror of this kind therefore includes two interfaces, a substrate/reflective coating interface and a reflective coating/protective film interface; these are weak points because they can be the site of separation leading to tarnishing, blistering and, in all cases, serious deterioration of the mirror.

In the prior art, the special mirrors described above are generally made by depositing a metal referred to as "from the platinum mine", i.e. from group VIII of the periodic table of the elements, and more particularly rhodium, ruthenium or palladium. These metals are of acceptable reflectivity, close to 60%. They are not sensitive to tarnishing and have good resistance to mechanical aggression because of their high hardness. However, this technique has major disadvantages connected with the difficulty of making coatings with these metals and their very high cost.

Some manufacturers make mirrors by depositing pure aluminium or silver protected by a transparent polymer onto a metal, polymer or ceramic substrate. Such mirrors have excellent optical properties but cannot be used in an aggressive atmosphere as they deteriorate very quickly through tarnishing, blistering and scaling of the coating.

A layer of titanium has been used, associated or not with a layer of chromium, as described in FR 2768096, but these structures deteriorate quickly in an aggressive environment, to the point that FR 2768096 recommends depositing the layers onto the rear face of a transparent support, indicating that it is then particularly well protected from mechanical and chemical influences.

Alloys of titanium and aluminium are known in the art. They are used to confer mechanical properties on the titanium; these alloys have a low aluminium content and generally contain copper.

SUMMARY OF THE INVENTION

One object of the present invention is to provide a metal alloy simultaneously having the properties of being a good reflector and of forming very strong chemical bonds with the substrates, in particular polymer substrates, so that the two interfaces mentioned above are resistant to most forms of atmospheric aggression, whether of an industrial or saline nature.

Another object of the invention is to provide metal alloys that are intrinsically resistant to corrosion and therefore to tarnishing.

A further object of the invention is to provide an alloy forming chemical bonds which are not degraded by variations in temperature over a wide range of use with the substrates, in particular with polymer substrates.

It is also an object of the invention to provide reflective coatings at reduced cost.

The above objects, together with others that will become apparent on reading the following description, are satisfied by the present invention which provides a microcrystalline metal alloy based on aluminium and titanium whose aluminium content is from 80 to 90 atomic percent, whose titanium content is from 10 to 20 atomic percent, that is not in thermodynamic equilibrium, and that is therefore resistant to oxidation and to corrosion, and that simultaneously has a remarkable capacity for adhesion to polymer materials.

In the context of the invention, the term "microcrystalline" refers to a crystal having a size less than approximately 1 μm. According to the invention, a microcrystalline alloy is therefore constituted of crystals having a size less than approximately 1 μm.

The performance of the metal alloy of the invention, in particular with regard to its reflectivity, is improved if the alloy is purer. However, up to 2 atomic percent of impurities can be tolerated without significantly affecting the performance of the alloy.

DETAILED DESCRIPTION OF THE INVENTION

Consequently, in one preferred embodiment of the invention the metal alloy comprises not more than approximately 2 atomic percent of impurities.

In a preferred embodiment of the invention the metal alloy has an aluminium content from 84 to 87 atomic percent and a a titanium content from 13 to 16 atomic percent.

It has been necessary to overcome a major prejudice to arrive at the present invention because it is well known in the art that adding addition elements to aluminium will normally significantly reduce its reflectivity.

Alloys of titanium and aluminium are known in the art but these are generally alloys with a low content of aluminium and generally contain copper and are used to confer mechanical properties on the titanium.

Aluminium alloys with a low content of titanium have been described, generally associated with equivalent quantities of manganese and magnesium, the titanium content not exceeding one atom percent. Intended for the fabrication of hollow bodies under pressure, such alloys are totally outside the field of application and the scope of the invention.

The publication "Binary Alloy Phase Diagrams" by T. B. Massalski, vol 1, pages 175–176, discloses alloys of aluminium and titanium whose aluminium content is from 80 to 90 atomic percent and whose titanium content is from 10 to 20 atomic percent. These alloys, which are outside the scope of the present invention, are in thermodynamic equilibrium and are not microcrystalline. They do not have the required resistance to oxidation and to corrosion and do not have a significant capacity for adhesion to polymer materials.

The present invention also provides a reflective coating consisting of a layer of metal alloy according to the invention described above covered with a protective film.

The metal alloy is an alloy based on aluminium and microcrystalline titanium which is not in thermodynamic equilibrium, whose aluminium content is from 80 to 90 atomic percent and whose titanium content is from 10 to 20 atomic percent.

In a preferred embodiment of the invention the reflective coating consists of a layer of metal alloy covered with a transparent protective film, and the metal alloy is an alloy based on aluminium and titanium whose aluminium content is from 80 to 90 atomic percent, whose titanium content is from 10 to 20 atomic percent and whose impurities content is at most equal to approximately 2 atomic percent.

In the reflective coatings of the present invention the protective film is usually a polymer material.

The thickness of the metal alloy layer is generally from 0.01 to 5 $\mu$m.

Below 0.01 $\mu$m the coating is quasi-transparent. Beyond 5 $\mu$m the reflectivity is degraded, although the other properties are not affected.

The thickness of the layer of metal alloy is preferably from 0.01 to 3 $\mu$m and more preferably from 0.01 to 0.5 $\mu$m.

The present invention also provides a mirror comprising a substrate supporting a reflective coating as described above.

The substrate is generally a polymer material.

To obtain a special mirror having a specular reflectivity at least equal to approximately 65%, good resistance to corrosion and to oxidation, it is necessary to choose a reflective coating consisting of a layer of metal alloy covered with a transparent protective film, characterized in that the metal alloy is an alloy that is based on aluminium and microcrystalline titanium, that is not in thermodynamic equilibrium, whose aluminium content is from 80 to 90 atomic percent, whose titanium content is from 10 to 20 atomic percent, and whose impurities content is at most equal to approximately 2 atomic percent, and in which the thickness of the alloy layer is from 0.01 to 3 $\mu$m.

When the reflective coatings of the invention are deposited on a polymer substrate and protected by a transparent protective film, the combination can be exposed to a corrosive atmosphere such as that of the salt mist test of ISO standard 9227 without affecting the reflectivity or causing defects to appear at the interfaces.

The aluminium/titanium alloy according to the invention can be deposited by any appropriate means; however, vacuum deposition techniques such as cathode sputtering in its various forms, evaporation and co-evaporation under certain conditions (which can readily be determined by the skilled person in order to obtain microcrystals) represent means that are particularly indicated for making such materials in the form of thin layers.

The mirrors of the invention, in particular the special mirrors, can be parts of components such as automobile rear view mirrors or billboards.

The alloy in accordance with the invention has a very high affinity for and a very high adhesion to polymers.

The corrosion resistance is also high because the reflecting face of the mirror is in direct contact with the atmospheric agents and is not protected from oxidation.

Nippon Jidosha patent JP 61133902 describes a mirror consisting of a glass substrate on which are successively deposited a transparent layer of $TiO_2$ and a reflective layer of an aluminium alloy, for example aluminium titanium alloy. The aim is to make a coloured mirror, the colour being produced by luminous interference within the $TiO_2$ layer. The titanium dioxide is the most important component of the coloured mirror. Note that the reflecting layer of aluminium alloy is on the rear part of the glass relative to the light rays; its reflecting face is therefore protected from oxidation. What is more, the aluminium alloy of the above patent, which is in contact with a ceramic, unlike that of the present invention, does not have to adhere to or have an affinity for a polymer, ceramics being entirely different from polymers on the physical-chemical plane.

The invention will now be described in more detail with reference to the following non-limiting examples.

EXAMPLE 1

This example concerns the production of a mirror to be used outdoors.

The structure of the mirror was made of polycarbonate (substrate).

It had to resist abrasive wear by particles entrained by the wind and also corrosion due to rain and industrial atmospheres. To this end, a 0.1 $\mu$m thick layer of aluminium titanium alloy according to the invention containing 85 atomic percent aluminium, the remainder being titanium, was deposited by vacuum deposition, for example cathode sputtering, and then protected by a transparent coating (protective film) that was resistant to wear and was based on polysiloxane.

The reflectivity of the mirror was 67%±1%, the adhesion of its coating was measured in accordance with ISO standard 2409 and the result was class 0. The mirror was aged artificially by exposure to a saline atmosphere according to ISO standard 9227 for 400 hours. It was then washed, dried and tested again for adhesion; the result was class 0, no unsticking or scaling having appeared. The reflectivity after the test was 66%±1%, the difference relative to the initial value was in the order of magnitude of the measurement errors.

By way of comparison, a mirror made conventionally by depositing pure aluminium of the same thickness onto a polycarbonate substrate and then covering it with the same polysiloxane coating was subjected to the same test; after 400 hours exposure to salt mist, the coatings had come unstuck over approximately 30% of the surface of the mirror, which was unusable.

EXAMPLE 2

A mirror for use in infrared heating was produced. The mirror had to be able to support working temperatures of 200° C. without affecting its performance. To this end, a polyetherimide structure was used and was coated by vacuum deposition with a layer of aluminium titanium alloy according to the invention. Its composition was 87 atomic percent aluminium and 13 atomic percent titanium. Its thickness was 5 micrometers.

The intrinsic reflectivity of the mirror was 70° C. The adhesion of the coating, tested by the method cited in example 1, gave a result of class 0. The mirror was subjected to a series of tests alternating periods of one hour at 200° C. and two hours at room temperature. The test was stopped after ten cycles and the characteristics were measured again. The adhesion test result was class 0, the reflectivity was unchanged.

By way of comparison, the same tests were carried out on two prior art mirrors, one obtained by coating a polyetherimide substrate with 1 micrometer of gold and the other by coating the same substrate with pure aluminium. After ten cycles, the gold coating had become partly unstuck, rendering the mirror unusable, the reflectivity of the aluminium coating, that was 95%, was reduced to 52% by the growth of a surface oxide layer.

EXAMPLE 3

A billboard was made intended to be displayed outdoors. The billboard was made from acrylonitrile-butadiene-styrene (ABS) and had to have a bright metallic appearance. The service life on site had to be greater than five years.

To this end, a billboard was metal-plated with an alloy of aluminium and titanium according to the invention containing 82 atomic percent aluminium and 18 atomic percent titanium. Its thickness was 0.3 micrometers. It was then coated with a transparent protective varnish 20 micrometers thick. The adhesion of the coatings measured by the test cited in example 1 was class 0; its reflectivity was 68%.

Ageing was simulated by 100 hours exposure to salt mist in accordance with the standardized test cited in Example 1. At the end of the test, the billboard was washed, dried and its characteristics were measured again. The adhesion remained unchanged and the reflectivity was 65%. This slight variation was associated with slight surface attack of the protective varnish by salt mist.

By way of comparison, the same tests were applied to a billboard coated with a 0.1 micrometer thick deposit of chromium by the usual electroplating technique and protected by the same varnish. The reflectivity was 70% and the adhesion class was 0. After exposure to salt mist the reflectivity was reduced to 66% for the same reasons but the adhesion class was only 1.

EXAMPLE 4

Non-microcrystalline Alloy (not in Accordance with the Invention)

To make high-performance mirrors on a light plastics material substrate, an ingot of AlTi alloy containing 13% titanium was cast and rolled to obtain a film 10 µm thick. X-ray examination of the film confirmed that its crystallographic structure conformed to that predicted by the aluminium titanium state diagram.

The alloy was not microcrystalline and was in thermodynamic equilibrium.

The alloy film was then rolled conjointly with a polymer film to reduce the thickness of the metal layer to 0.2 µm.

The metallized plastics material film was then glued to the polycarbonate substrate constituting the framework of the mirror. The whole was then covered with a layer of transparent antiscratch varnish to protect the reflecting surface from damage, this technique enabling easy industrialization and low cost mass production.

The reflectivity of the mirror was 75%.

To verify its durability, the mirror was subjected to the salt mist test described in Example 1 above. After testing for 24 hours, which was notably too short, the layer of protective varnish was particularly degraded. Examination with a microscope showed that the origin of the degradation was insufficient adhesion of the polymer varnish to the aluminium titanium alloy obtained in this way.

What is claimed is:

1. A reflective coating adapted to be submitted to oxidation and corrosion and adapted to be adhered to a polymer material, comprising a layer of metal alloy deposited under vacuum, said metal alloy containing from 80 to 87 atomic percent of aluminium and 13 to 20 atomic percent of titanium.

2. The reflective coating of claim 1, wherein the metal alloy has a grain size of at most 1 micron.

3. The reflective coating of claim 2, wherein the metal alloy is not in thermodynamic equilibrium.

4. The reflective coating of claim 1, wherein the metal alloy contains not more than about 2 atomic percent of impurities.

5. The reflective coating of claim 1, wherein the aluminium content is from 84 to 87 atomic percent and the titanium content is from 13 to 16 atomic percent.

6. The reflective coating of claim 1, further comprising a protective film on the layer of the metal alloy.

7. The reflective coating of claim 6, wherein the protective film is a transparent protective film.

8. The reflective coating of claim 6, wherein the protective film comprises a film of polymer material.

9. The reflective coating of claim 1, wherein the metal alloy layer is from 0.01 to 5 microns thick.

10. The reflective coating of claim 9, wherein the metal alloy layer is from 0.01 to 3 microns thick.

11. The reflective coating of claim 10, wherein the metal alloy layer is from 0.01 to 0.05 microns thick.

12. A mirror comprising a substrate and a reflective coating adapted to be submitted to oxidation and corrosion, comprising a layer of metal alloy deposited under vacuum on the substrate, said metal alloy containing from 80 to 90 atomic percent of aluminium and 10 to 20 atomic percent of titanium.

13. The mirror of claim 12, wherein the substrate comprises a polymer material.

14. The mirror of claim 12, wherein the metal alloy layer is covered with a protective film.

15. The mirror of claim 12, wherein the titanium content is not less than 13 atomic percent.

16. The mirror of claim 15, wherein the titanium content is not more than 16 atomic percent.

17. The mirror of claim 12, having a specular reflectivity at least equal to approximately 65% and good resistance to corrosion and to oxidation.

18. A component comprising the mirror according to claim 12.

19. The component of claim 18, constituting an automobile rear view mirror.

20. The component of claim 19, constituting a billboard.

21. A mirror comprising a substrate supporting a metal alloy based on aluminium and titanium whose aluminium content is from 80 to 90 atomic percent and the titanium content is from 10 to 20 atomic percent, the grain size of the alloy being not more than 1 micron and the alloy not being in thermodynamic equilibrium, and a protective film covering the metal alloy.

22. The mirror according to claim 21, wherein the substrate comprises a polymer material.

23. The mirror according to claim 21, wherein the titanium content is not less than about 13 atomic percent.

* * * * *